(12) United States Patent
Hanagata (10) Patent No.: US 12,125,846 B2
(45) Date of Patent: Oct. 22, 2024

(54) SEMICONDUCTOR DEVICE WITH COMPLEMENTARY CATHODE REGIONS

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Shoko Hanagata, Komatsu Ishikawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 82 days.

(21) Appl. No.: 17/190,029

(22) Filed: Mar. 2, 2021

(65) Prior Publication Data

US 2022/0085009 A1  Mar. 17, 2022

(30) Foreign Application Priority Data

Sep. 15, 2020  (JP) .................................. 2020-154929

(51) Int. Cl.
| | |
|---|---|
| H01L 27/07 | (2006.01) |
| H01L 29/06 | (2006.01) |
| H01L 29/417 | (2006.01) |
| H01L 29/739 | (2006.01) |
| H01L 29/868 | (2006.01) |

(52) U.S. Cl.
CPC .... *H01L 27/0716* (2013.01); *H01L 29/41708* (2013.01); *H01L 29/7395* (2013.01); *H01L 29/868* (2013.01); *H01L 29/0692* (2013.01)

(58) Field of Classification Search
CPC ..... H01L 29/41708; H01L 29/861–868; H01L 27/0716
See application file for complete search history.

(56) References Cited

U.S. PATENT DOCUMENTS

| | | | |
|---|---|---|---|
| 9,054,066 B2 | 6/2015 | Ogura et al. | |
| 10,170,607 B2 | 1/2019 | Kouno | |
| 2014/0061875 A1* | 3/2014 | Ogura | ................. H01L 29/7802 |
| | | | 257/655 |

(Continued)

FOREIGN PATENT DOCUMENTS

| | | |
|---|---|---|
| JP | 2014063980 A | 4/2014 |
| JP | 2014157930 A | 8/2014 |

(Continued)

OTHER PUBLICATIONS

Japanese Office Action dated Jul. 25, 2023, mailed in counterpart Japanese Application No. 2020-154929, 8 pages (with translation).

*Primary Examiner* — Tucker J Wright
(74) *Attorney, Agent, or Firm* — Kim & Stewart LLP (57) ABSTRACT

A semiconductor device includes first and second electrodes, first regions of a first conductivity type, second regions of a second conductivity type, a third region of the first conductivity type, fourth regions of the second conductivity type, fifth regions of the second conductivity type. The first and second regions are on the first electrode. The third region is on the first and second regions. The fourth and fifth regions are on the third region. The second electrode is on the fourth and fifth regions. Every second region is directly below a fifth region.

20 Claims, 9 Drawing Sheets

(56) References Cited

U.S. PATENT DOCUMENTS

| | | | | |
|---|---|---|---|---|
| 2014/0231867 A1* | 8/2014 | Yamashita | .......... | H01L 29/7813 |
| | | | | 257/140 |
| 2016/0079235 A1* | 3/2016 | Matsu | ................ | H01L 29/0603 |
| | | | | 257/140 |
| 2018/0226400 A1 | 8/2018 | Shinsho | | |
| 2018/0315863 A1 | 11/2018 | Masuoka | | |
| 2019/0157466 A1 | 5/2019 | Honda | | |

FOREIGN PATENT DOCUMENTS

| | | |
|---|---|---|
| JP | 2016058654 A | 4/2016 |
| JP | 2017-045949 A | 3/2017 |
| JP | 2019096708 A | 6/2019 |
| WO | 2017149607 A1 | 9/2017 |

* cited by examiner

SEMICONDUCTOR DEVICE WITH COMPLEMENTARY CATHODE REGIONS

CROSS-REFERENCE TO RELATED APPLICATION(S)

This application is based upon and claims the benefit of priority from Japanese Patent Application No. 2020-154929, filed Sep. 15, 2020, the entire contents of which are incorporated herein by reference.

FIELD

Embodiments described herein relate generally to a semiconductor device.

BACKGROUND

Semiconductor devices such as diodes are being used for the purpose of power conversion, for example. Such semiconductor devices are required to be improved in electrical characteristics thereof exhibited at the time of a cutoff of current.

DETAILED DESCRIPTION

Embodiments provide a semiconductor device having improved electrical characteristics at the time of a cutoff of current.

In general, according to one embodiment, a semiconductor device comprises a first electrode and a plurality of first semiconductor regions of a first conductivity type on the first electrode. The first semiconductor regions are spaced from each other in a first direction and extend in a second direction perpendicular to the first direction. A plurality of second semiconductor regions of a second conductivity type is on the first electrode. Each second semiconductor region being adjacent to at least one of the first semiconductor regions in the first direction and extending in the second direction. A third semiconductor region of the first conductivity type is on the plurality of first semiconductor regions and the plurality of second semiconductor regions. The third semiconductor region has a dopant concentration of the first conductivity type that is less than that of the plurality of first semiconductor regions. The plurality of first semiconductor regions and the plurality of second semiconductor regions are between the third semiconductor region and the first electrode in a third direction orthogonal to the first and second directions. A plurality of fourth semiconductor regions of the second conductivity type is on the third semiconductor region. The fourth semiconductor regions are spaced from each other in the first direction and extend in the second direction. A plurality of fifth semiconductor regions of the second conductivity type is on the third semiconductor region. The fifth semiconductor regions are each adjacent to at least one fourth semiconductor region in the first direction and extend in the second direction. The fifth semiconductor regions have a dopant concentration of the second conductivity type greater than that of the plurality of fourth semiconductor regions. A second electrode is on the plurality of fourth semiconductor regions and the plurality of fifth semiconductor regions. In the semiconductor device, each second semiconductor region is directly below one of the plurality of fifth semiconductor regions in the third direction.

Hereinafter, certain example embodiments of the present disclosure will be described with reference to the drawings.

The drawings are merely schematic or conceptual, and depicted dimensions, and relationships between depicted dimensions, such a thickness and width of each depicted portion and a ratio between sizes of respective portions are not necessarily the same as those of an actual device. Even when the same portion is illustrated in different drawings, the relative dimensions or ratios thereof may be illustrated in different manners depending on the drawings.

In the following description and drawings, the "$n^+$", "$n$", "$n^-$", "$p^{++}$", "$p^+$", and "$p$" represent the relative highness and lowness of each impurity concentration. More specifically, a notation with "++" suffixed thereto indicates that the impurity concentration is relatively higher than that represented by a notation with a notation with "+" suffixed thereto. A notation with "+" suffixed thereto indicates that the impurity concentration is relatively higher than that represented by a notation with neither of "+" and "−" suffixed thereto. A notation with "−" suffixed thereto indicates that the impurity concentration is relatively lower than that represented by a notation with neither of "+" and "−" suffixed thereto. Both a p-type impurity and an n-type impurity can be contained in each of the respective regions no matter the notation, these concentration related notations represent the relative highness and lowness of a net impurity concentration obtained after such impurities compensate for each other.

First Embodiment

Figure 1:
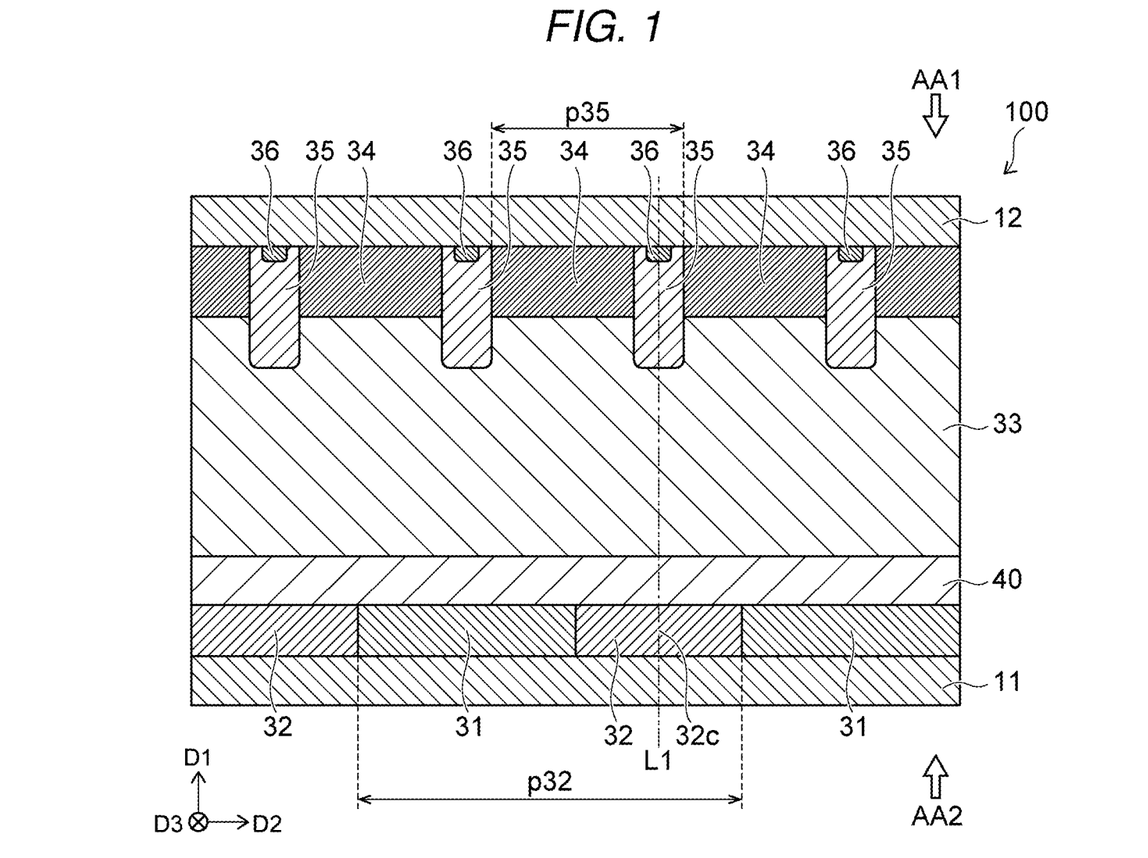
FIG. 1 is a cross-sectional view illustrating a semiconductor device according to a first embodiment.

FIG. 1 is a cross-sectional view illustrating a semiconductor device according to a first embodiment.

A semiconductor device 100 according to the first embodiment illustrated in FIG. 1 is a diode.

The semiconductor device 100 includes a first electrode 11, a second electrode 12, a plurality of $n^+$ type cathode regions 31, a plurality of $p^+$ type cathode regions 32, an $n^-$ type drift region 33, a plurality of p type anode regions 34, and a plurality of $p^+$ type anode regions 35. In this example, the semiconductor device 100 further includes a plurality of $p^{++}$ type anode regions 36 and an n type buffer region 40.

Here, the direction which leads from the first electrode 11 to the plurality of $n^+$ type cathode regions 31 is referred to as a "first direction D1". The first direction D1 is, for example, a direction perpendicular to the upper surface of the first electrode 11. Two directions perpendicular to the first direction D1 and orthogonal each other are referred to as a "second direction D2" and a "third direction D3". Moreover, for the purpose of illustration, the direction which leads from the first electrode 11 to the $n^+$ type cathode regions 31 is referred to as "above, " "upward, " or the like, and the direction opposite thereto is referred to as "below," "lower," or the like. These directions are based on a relative positional relationship between the first electrode 11 and the $n^+$ type cathode regions 31 and are independent of the direction of gravitational force.

Figure 2A:
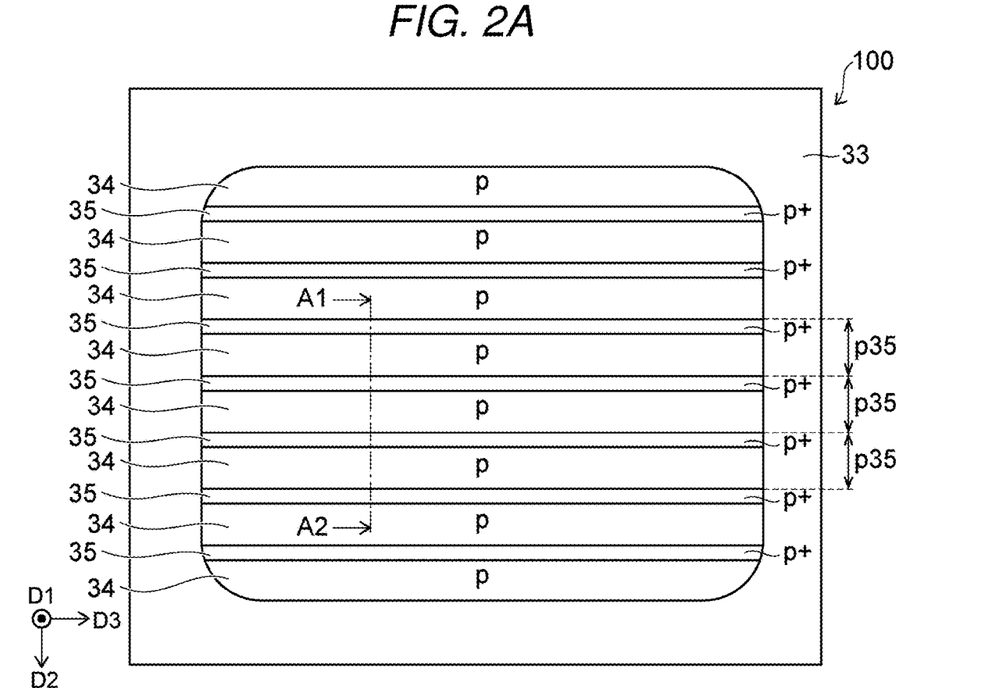
FIGS. 2A and 2B are plan views illustrating a semiconductor device according to a first embodiment.
Figure 2B:
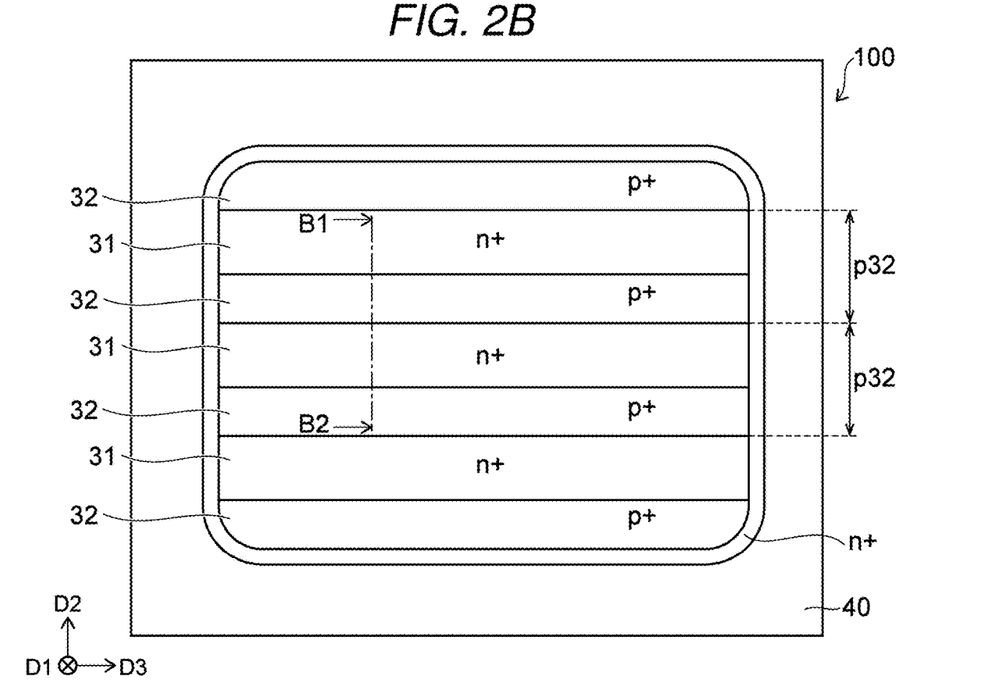

FIGS. 2A and 2B are plan views illustrating the semiconductor device according to the first embodiment.

FIG. 2A is a plan view of the semiconductor device 100 as viewed from an arrow AA1 illustrated in FIG. 1. Thus, FIG. 2A illustrates an obverse surface (upper surface) side of the semiconductor device 100. FIG. 2B is a plan view of the semiconductor device 100 as viewed from an arrow AA2 illustrated in FIG. 1. Thus, FIG. 2B illustrates a reverse surface (lower surface) side of the semiconductor device 100. FIG. 1 corresponds to a cross-sectional view taken along line A1-A2 in FIG. 2A and also corresponds to a cross-sectional view taken along line B1-B2 in FIG. 2B. Furthermore, in FIG. 2A, the second electrode 12 and the plurality of $p^{++}$ type anode regions 36 are omitted from illustration. In FIG. 2B, the first electrode 11 is omitted from illustration.

For example, as illustrated in FIG. 1, the first electrode 11 is provided as the lower surface of the semiconductor device 100. The plurality of $n^+$ type cathode regions 31 is provided on the first electrode 11 and is electrically connected to the first electrode 11. The plurality of $p^+$ type cathode regions 32 is provided on the first electrode 11, is located side by side with the plurality of $n^+$ type cathode regions 31 in the second direction D2, and is electrically connected to the first electrode 11.

The n type buffer region 40 is provided on the plurality of $n^+$ type cathode regions 31 and the plurality of $p^+$ type cathode regions 32. The $n^-$ type drift region 33 is provided on the n type buffer region 40. Thus, the $n^-$ type drift region 33 is above the plurality of $n^+$ type cathode regions 31 and the plurality of $p^+$ type cathode regions 32. The n type impurity concentration in the n type buffer region 40 is lower than the n type impurity concentration in the $n^+$ type cathode regions 31. The n type impurity concentration in the $n^-$ type drift region 33 is lower than the n type impurity concentration in the n type buffer region 40.

The plurality of p type anode regions 34 is provided on the $n^-$ type drift region 33. The plurality of $p^+$ type anode regions 35 is provided on the $n^-$ type drift region 33. The respective upper portions of the plurality of $p^+$ type anode regions 35 are located side by side with the plurality of p type anode regions 34 in the second direction D2. The p type impurity concentration in the plurality of $p^+$ type anode regions 35 is higher than the p type impurity concentration in the plurality of p type anode regions 34. The respective lower ends of the plurality of $p^+$ type anode regions 35 are located below the plurality of p type anode regions 34. Each $p^+$ type anode region 35 has a shape projecting toward below the plurality of p type anode regions 34. The lower portion of each $p^+$ type anode region 35 is located side by side with the $n^-$ type drift region 33 in the second direction D2 and is surrounded by the $n^-$ type drift region 33.

The plurality of $p^{++}$ type anode regions 36 is provided on the plurality of $p^+$ type anode regions 35. The lower portion and lateral portion of each of the plurality of $p^{++}$ type anode regions 36 are surrounded by one of the $p^+$ type anode regions 35. The p type impurity concentration in the plurality of $p^{++}$ type anode regions 36 is higher than the p type impurity concentration in the $p^+$ type anode regions 35.

The second electrode 12 is provided on the plurality of p type anode regions 34, the plurality of $p^+$ type anode regions 35, and the plurality of $p^{++}$ type anode regions 36. The second electrode 12 is electrically connected to the plurality of p type anode regions 34, the plurality of $p^+$ type anode regions 35, and the plurality of $p^{++}$ type anode regions 36. A Schottky contact is formed at the interface between the plurality of p type anode regions 34 and the second electrode 12.

As illustrated in FIG. 2A, the p type anode regions 34 are arranged side by side in the second direction D2 and each extends in the third direction D3. For example, the plurality of p type anode regions 34 is spaced from each other periodically or at even intervals in the second direction D2. The width (the dimension taken along the second direction D2) of each p type anode region 34 may be the same as the width of the other p type anode regions 34. The lengths of the p type anode regions 34 even along the third direction D3.

The plurality of $p^+$ type anode regions 35 is arranged side by side in the second direction D2 and each extends in the third direction D3. For example, the plurality of $p^+$ type anode regions 35 are spaced periodically or at even intervals in the second direction D2. The width of each $p^+$ type anode region 35 may be the same as the width of other $p^+$ type anode regions 35. The lengths of the $p^+$ type anode regions 35 may be even in the third direction D3. The number of $p^+$ type anode regions 35 is, for example, between 240 600. The same also applies to the plurality of $p^{++}$ type anode regions 36 (see FIG. 1).

The plurality of p type anode regions 34 and the plurality of $p^+$ type anode regions 35 are alternately arranged side by side with each other in the second direction D2 on a one by one basis . Thus, one $p^+$ type anode region 35 is located between otherwise adjacent pairs of p type anode regions 34. Moreover, excepting at outer ends, each p type anode region 34 is located between a pair of otherwise adjacent $p^+$ type anode regions 35.

As illustrated in FIG. 2B, the plurality of $n^+$ type cathode regions 31 is arranged side by side in the second direction D2 and each extends in the third direction D3. For example, the plurality of $n^+$ type cathode regions 31 is arranged side by side periodically or at even intervals in the second direction D2. The width of each $n^+$ type cathode region 31 may be the same as the width of the other $n^+$ type cathode regions 31.

The plurality of $p^+$ type cathode regions 32 is arranged side by side in the second direction D2 and each extends in the third direction D3. For example, the plurality of $p^+$ type cathode regions 32 is arranged side by side periodically or at even intervals in the second direction D2. The width of each $p^+$ type cathode region 32 may be the same as the width of the other $p^+$ type cathode regions 32. The number of $p^+$ type cathode regions 32 is, for example, between 18 and 180.

The plurality of $n^+$ type cathode regions 31 and the plurality of $p^+$ type cathode regions 32 are alternately arranged side by side with each other in the second direction D2 on one by one basis. Thus, each $n^+$ type cathode region 31 is located between a pair of otherwise adjacent $p^+$ type cathode regions 32. Moreover, excepting at the outer edges, each $p^+$ type cathode region 32 is located between a pair of otherwise adjacent $n^+$ type cathode regions 31.

As illustrated in FIG. 1, some of the $p^+$ type anode regions 35 are located directly above $p^+$ type cathode regions 32. For example, at least one $p^+$ type anode region 35 is located directly above one $p^+$ type cathode region 32. Two or more $p^+$ type anode regions 35 may be located directly above $p^+$ type cathode regions 32.

In this context, the phrase "directly above" means "on a straight line which extends in parallel with the first direction D1". For example, as illustrated in FIG. 1, a particular one of the $p^+$ type cathode regions 32 is located on a straight line L1 (which is parallel to the first direction D1) with a particular one of the $p^+$ type anode regions 35. In other words, at least a part of each $p^+$ type cathode region 32 overlaps with one of the $p^+$ type anode regions 35 in the first direction D1. The phrase "directly below" is similarly defined in this context, but with an opposite reference point. That, while the particular one of the $p^+$ type anode regions 35 in FIG. 1 is said to be "directly above" the particular the one of the $p^+$ type cathode regions 32 in FIG. 1, the $p^+$ type cathode region 32 would be said to be "directly below" the $p^+$ type anode region 35.

In this example, when one of the $p^+$ type anode regions 35 is directly above a $p^+$ type cathode region 32, the $p^+$ type anode regions 35 is furthermore directly above the center 32c (which is the midpoint of the respective $p^+$ type cathode region 32 in the second direction D2) of the $p^+$ type cathode region 32. Additionally, in this example, the $p^{++}$ type anode region 36 within the $p^+$ type anode region 35 is also directly above the center 32c of the $p^+$ type cathode region 32. In other words, the centers 32c of the $p^+$ type cathode regions 32 overlap with $p^+$ type anode regions 35 and $p^{++}$ type anode regions 36 in the first direction D1.

Furthermore, not all of the $p^+$ type anode regions 35 (or the $p^{++}$ type anode regions 36) are located directly above one of the $p^+$ type cathode regions 32. For example, upon observation of a cross-section parallel to the first direction D1 as in FIG. 1, it can be seen that only every other one of the $p^+$ type anode regions 35 is located directly above a $p^+$ type cathode region 32. In other examples, only every third one of the $p^+$ type anode regions 35 might be directly above a $p^+$ type cathode region 32. In other examples, only every fourth, fifth, sixth, or more of the $p^+$ type anode regions 35 might be directly above a $p^+$ type cathode region 32.

The pitch in the second direction D2 of the plurality of $p^+$ type cathode regions 32 is referred to as a "pitch p32". Furthermore, in this context, the term "pitch" refers to the length of a unit of repetition in position. The pitch p32 corresponds to a length taken along the second direction D2 from a position in the second direction D2 of one of the plurality of $p^+$ type cathode regions 32 to the same position of another one of the plurality of $p^+$ type cathode regions 32 adjacent in the second direction D2.

The pitch in the second direction D2 of the plurality of $p^+$ type anode regions 35 is referred to as a "pitch p35". The pitch p35 corresponds to a length taken along the second direction D2 between corresponding positions of adjacent $p^+$ type anode regions 35.

For example, the pitch p32 is an integer multiple of the pitch p35. In the example illustrated in FIG. 1, the pitch p32 is two times the pitch p35. Furthermore, "integer multiple" includes in this context, approximately an integer multiple corresponding to, for example, variations within a range of manufacturing errors and the like.

Examples of respective materials of elements of the semiconductor device 100 are described.

The plurality of $n^+$ type cathode regions 31, the plurality of $p^+$ type cathode regions 32, the n type buffer region 40, the $n^-$ type drift region 33, the plurality of p type anode regions 34, the plurality of $p^+$ type anode regions 35, and the plurality of $p^{++}$ type anode regions 36 contain semiconductor material such as silicon, silicon carbide, gallium nitride, or gallium arsenide. When silicon is used as the semiconductor material, an n type impurity to be used may include arsenic, phosphorus, or antimony. A p type impurity to be used may include boron.

The first electrode 11 and the second electrode 12 comprise metal such as aluminum. For example, when the second electrode 12 contains a material having a relatively large work function, the plurality of $p^{++}$ type anode regions 36 is provided to form an ohmic contact between the plurality of $p^+$ type anode regions 35 and the second electrode 12. For example, the second electrode 12 comprises aluminum or silicon. Alternatively, the second electrode 12 comprises titanium or tungsten. In these cases, it is desirable that the plurality of $p^{++}$ type anode regions 36 be provided.

Operations of the semiconductor device 100 are described.

When a voltage positive voltage is applied to the first electrode 11, a forward voltage is imparted to a pn junction interface between the $n^-$ type drift region 33 and the plurality of $p^+$ type anode regions 35 (carrier injection regions). Holes are injected from the plurality of $p^+$ type anode regions 35 into the $n^-$ type drift region 33, and electrons are injected from the plurality of $n^+$ type cathode regions 31 into the $n^-$ type drift region 33. Electric current flows from the second electrode 12 to the first electrode 11, so that the semiconductor device 100 enters into an on-state. When the semiconductor device 100 is in an on-state, holes and electrons are accumulated in the $n^-$ type drift region 33, so that the resistance of the $n^-$ type drift region 33 greatly decreases. Furthermore, due to a Schottky contact formed between the plurality of p type anode regions 34 and the second electrode 12, no carriers are injected from the plurality of p type anode regions 34 into the $n^-$ type drift region 33.

Then, when a positive voltage is applied to the second electrode 12, electric current flowing from the second electrode 12 to the first electrode 11 is cut off, so that the semiconductor device 100 enters into an off-state. Holes accumulated in the $n^-$ type drift region 33 are discharged to the second electrode 12 via the plurality of $p^+$ type anode regions 35. The accumulated electrons are discharged to the first electrode 11 via the plurality of $n^+$ type cathode regions 31. A depletion layer spreads to the $n^-$ type drift region 33 depending on voltages from a pn junction interface between the $n^-$ type drift region 33 and the plurality of $p^+$ type anode regions 35. The depletion layer spreading to the $n^-$ type drift region 33 acts to maintain a breakdown voltage.

The n type impurity concentration in the n type buffer region 40 is higher than the n type impurity concentration in the $n^-$ type drift region 33. Therefore, when a depletion layer spreads over the entire $n^-$ type drift region 33 in the first direction D1 and then reaches the n type buffer region 40, spreading of the depletion layer is restricted. This prevents the depletion layer from reaching the $n^+$ type cathode region 31.

Moreover, since the respective lower ends of the plurality of $p^+$ type anode regions 35 project below the plurality of p type anode regions 34, at the time of a cutoff of currents performed by switching the semiconductor device 100 from an on-state to an off-state, punch-through to the obverse surfaces of the plurality of p type anode regions 34 becomes unlikely to occur, so that the cutoff capacity of the semiconductor device 100 is improved.

As the plurality of p+ type cathode regions 32 is provided, holes are injected from the first electrode 11 into the n− type drift region 33 via the plurality of p+ type cathode regions 32 when the semiconductor device 100 is turned off. With this injection, a steep increase in electric potential difference between the first electrode 11 and the second electrode 12 is prevented or reduced at the time of turning-off of the semiconductor device 100. For example, the fluctuation of electric potential of the first electrode 11 is prevented or reduced, so that noise occurring due to the fluctuation in electric potential can be reduced.

Effects of the first embodiment are described.

In the first embodiment, at least some of the p+ type anode regions 35 are located directly above a p+ type cathode region 32. With this location, the fluctuation in electric potential difference between the first electrode 11 and the second electrode 12 when the semiconductor device 100 is turned off is prevented or reduced. For example, the fluctuation of electric potential of the first electrode 11 at the time of turning-off of the semiconductor device 100 and the fluctuation in the current flowing between the first electrode 11 and the second electrode 12 can be prevented or reduced. Accordingly, electrical characteristics of the semiconductor device 100 exhibited at the time of a cutoff of current (at the time of turning-off) can be improved.

When the semiconductor device 100 is in an on-state, many carriers are present below the plurality of p+ type anode regions 35, each of which is a carrier injection portion. Therefore, at the time of turning-off, many carries remain below the plurality of p+ type anode regions 35. Thus, many holes are present in the n− type drift region 33 and the n type buffer region 40. In this case, the barrier from the plurality of p+ type cathode regions 32 to the n− type drift region 33 and the n type buffer region 40 becomes low. Therefore, since p+ type anode regions 35 are located directly above the plurality of p+ type cathode regions 32, it is considered that a PNP transport efficiency from the p+ type cathode regions 32 to the p+ type anode regions 35 is improved and, at the time of recovery, holes become likely to be injected from the plurality of p+ type cathode regions 32 into the n− type drift region 33. It is considered that this enables the preventing or reducing of the fluctuation of electric potential or current occurring at the time of turning-off.

Figure 3A:
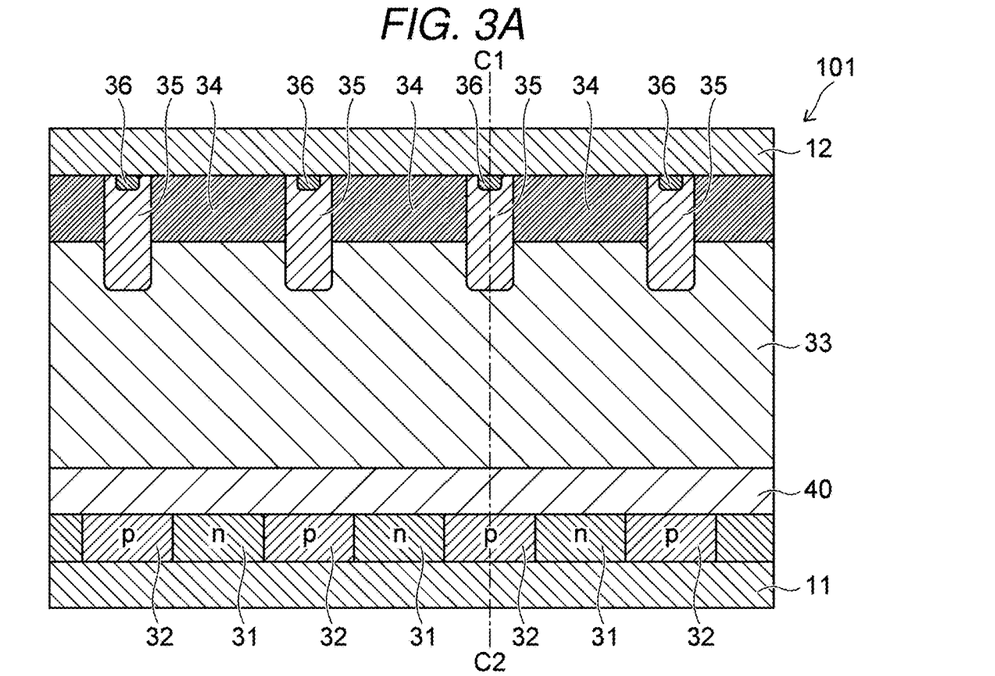
FIGS. 3A and 3B are cross-sectional views illustrating aspects of certain semiconductor devices.
Figure 3B:
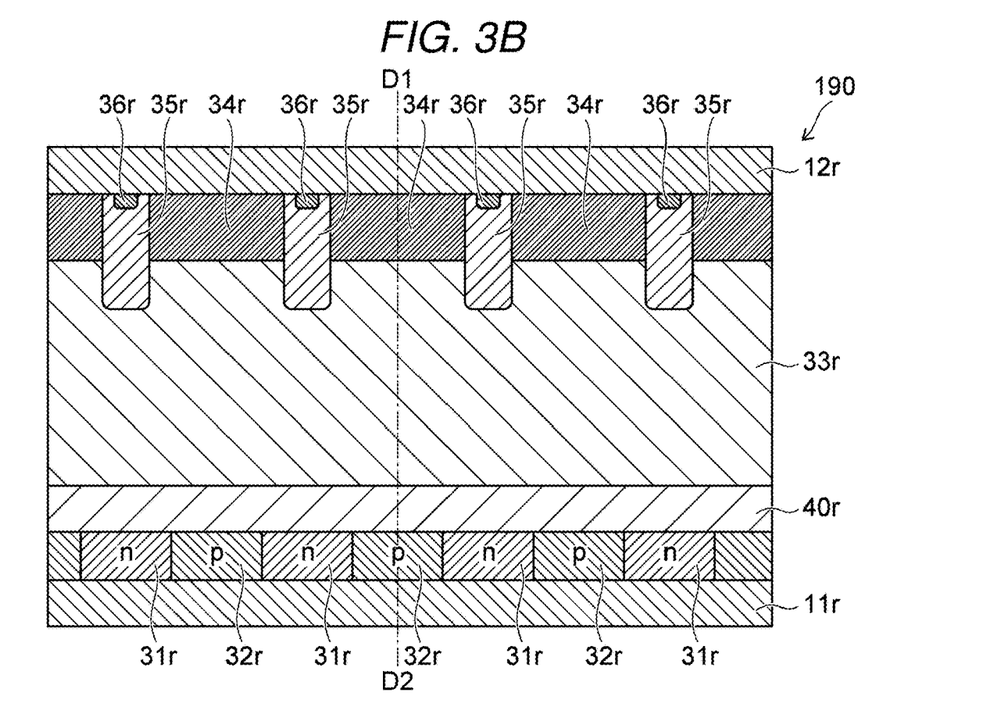

FIGS. 3A and 3B are cross-sectional views illustrating semiconductor devices.

FIG. 3A illustrates a semiconductor device 101 according to the first embodiment. FIG. 3B illustrates a semiconductor device 190 according to a comparative example.

Figure 4:
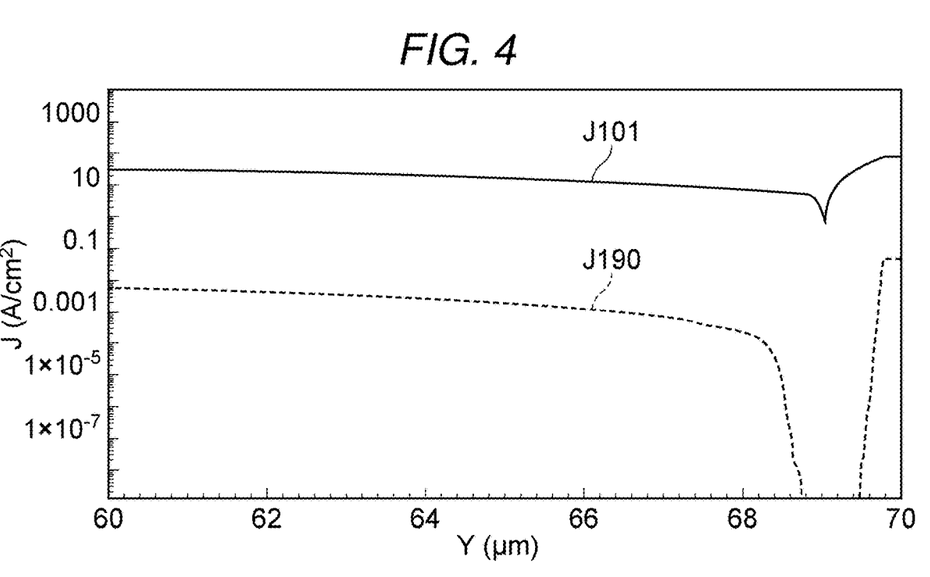
FIG. 4 is a graph illustrating simulation results obtained for certain semiconductor devices.
Figure 5A:
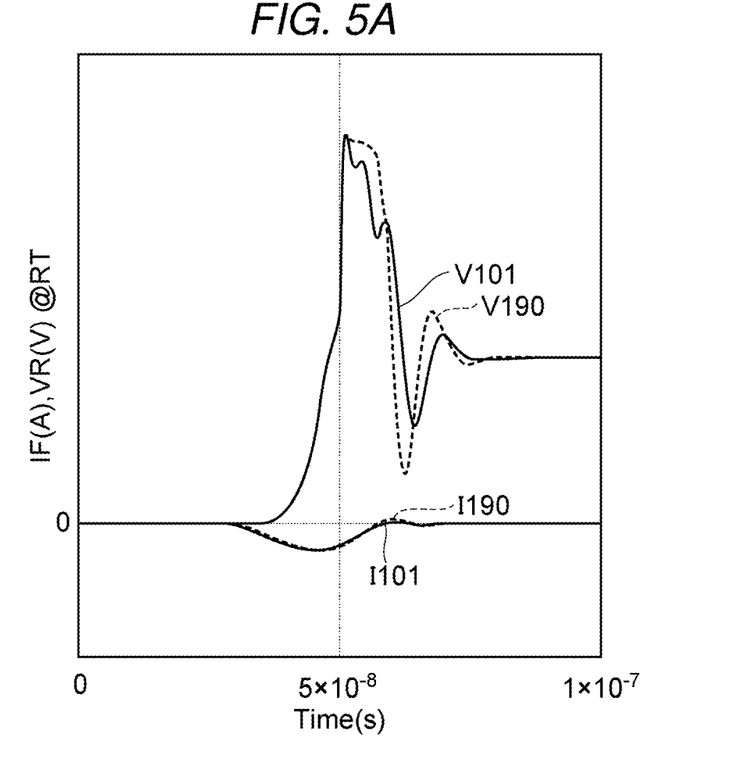
FIGS. 5A and 5B are graph illustrating simulation results obtained for certain semiconductor devices.
Figure 5B:
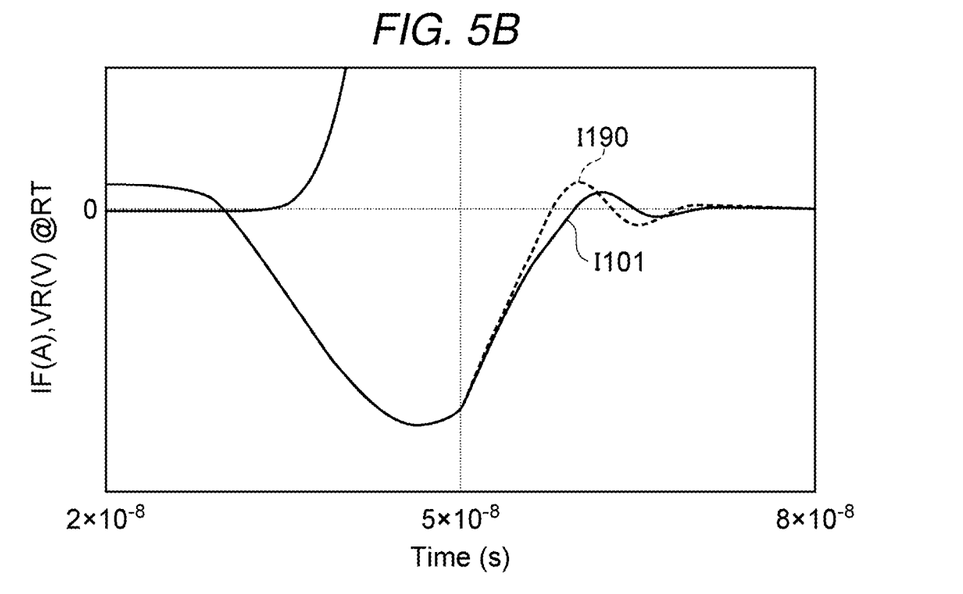

FIG. 4 and FIGS. 5A and 5B are graph illustrating simulation results obtained for the semiconductor device 101 and the semiconductor device 190.

As illustrated in FIG. 3A, in the semiconductor device 101, the pitch p32 (see FIG. 1) is equal to the pitch p35 (see FIG. 1). Other than this, the semiconductor device 101 is the similar to semiconductor device 100.

As illustrated in FIG. 3B, the semiconductor device 190 differs from the semiconductor device 101 in a positional relationship between p+ type cathode regions and p+ type anode regions. Other than this, the semiconductor device 190 cis similar to the semiconductor device 101. Thus, in the semiconductor device 190, a first electrode 11r, n+ type cathode regions 31r, p+ type cathode regions 32r, an n type buffer region 40r, an n− type drift region 33r, p type anode regions 34r, p+ type anode regions 35r, p++ type anode regions 36r, and a second electrode 12r are provided. In the semiconductor device 190, no p+ type anode region 35r is located directly above any p+ type cathode region 32r. The p+ type anode regions 35r are instead located directly above the n+ type cathode regions 31r.

FIG. 4 illustrates a relationship between a hole current density J (A/cm$^2$) and a position Y (μm) in the depth direction in each semiconductor device. The left-hand side of the horizontal axis corresponds to the anode side, and the right-hand side of the horizontal axis corresponds to the cathode side. A hole current density J101 is the hole current density obtained along a cross-section C1-C2 (see FIG. 3A) of the semiconductor device 101. A hole current density J190 is the hole current density obtained along a cross-section D1-D2 (see FIG. 3B) of the semiconductor device 190. The hole current density of the semiconductor device 101 is higher than the hole current density of the semiconductor device 190.

FIGS. 5A and 5B illustrate changes over time in current IF (A) and voltage VR (V) at the time of turning-off between the first and second electrodes of each semiconductor device. A voltage V101 and a current I101 represent characteristics of the semiconductor device 101. A voltage V190 and a current I190 represent characteristics of the semiconductor device 190. FIG. 5B is an enlarged view of a part of FIG. 5A. As illustrated in FIG. 5A, the fluctuation of the voltage V101 of the semiconductor device 101 is smaller than the fluctuation of the voltage V190 of the semiconductor device 190. Moreover, as illustrated in FIG. 5B, the fluctuation in the current I101 of the semiconductor device 101 is smaller than the fluctuation in the current I190 of the semiconductor device 190.

As compared with the semiconductor device 190, the hole current density is higher for the semiconductor device 101, so that the fluctuations of current and electric potential occurring at the time of turning-off can be prevented or reduced.

Moreover, when the p+ type anode region 35 (and the p++ type anode region 36) is located directly above the center 32c (see FIG. 1) of each of the plurality of p+ type cathode regions 32, holes become more likely to be injected at the time of turning-off, so that it is considered that the fluctuation in electric potential or current can be better prevented or reduced.

Moreover, the plurality of p+ type anode regions 35 is periodically arranged along the second direction D2, and the plurality of p+ type cathode regions 32 is periodically arranged along the second direction D2. Such a periodical pattern facilitates, for example, controlling the carrier density. For example, controlling the uniformity of the carrier density enables making the electrical characteristics more stable.

Additionally, the pitch p32 in the second direction D2 of the plurality of p+ type cathode regions 32 is integer multiple of the pitch p35 in the second direction D2 . Aligning a periodic pattern of the cathode side with a periodic pattern of the anode side in the above-mentioned way causes at least some of the plurality of p+ type anode regions 35 to be located directly above the p+ type cathode regions 32.

FIGS. 6A, 6B, 6C, and 6D are cross-sectional views illustrating simulations performed on various semiconductor devices according to the first embodiment.

Figure 6A:
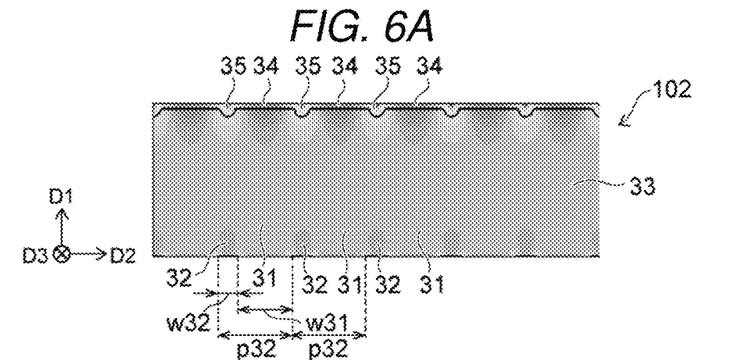
FIGS. 6A, 6B, 6C, and 6D are cross-sectional views illustrating simulations performed on semiconductor devices according to a first embodiment.

In a semiconductor device 102 illustrated in FIG. 6A, the pitch p32 is equal to the pitch p35 (see FIG. 1). The pitch p32 is 34 μm, and the p+ type cathode W32 (the length in the second direction D2 of one of the plurality of p+ type cathode regions 32) is 10 μm.

Figure 6B:
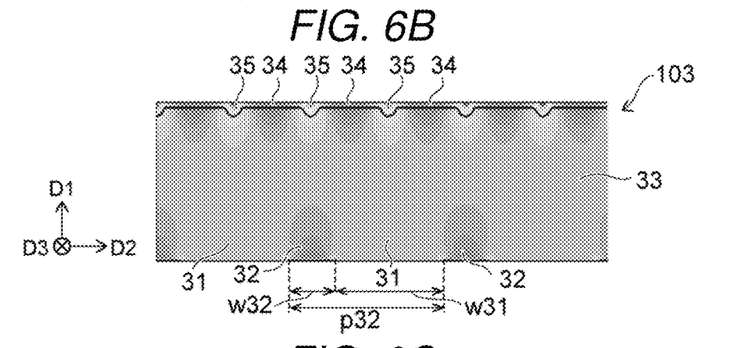

In a semiconductor device 103 illustrated in FIG. 6B, the pitch p32 is two times the pitch p35 (see FIG. 1). The pitch p32 is 68 μm, and the p⁺ type cathode W32 is 20 μm.

Figure 6C:
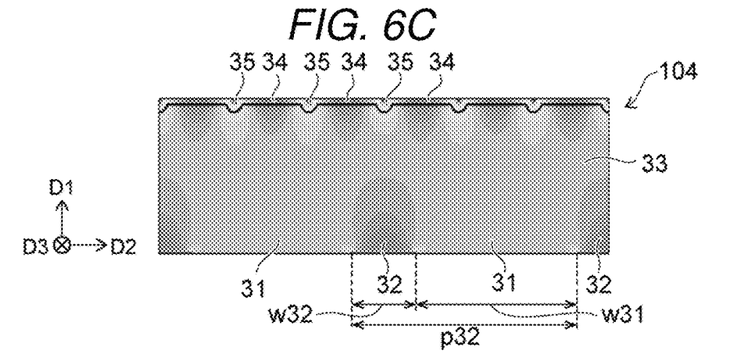

In a semiconductor device 104 illustrated in FIG. 6C, the pitch p32 is three times the pitch p35 (see FIG. 1). The pitch p32 is 102 μm, and the p⁺ type cathode W32 is 30 μm.

Figure 6D:
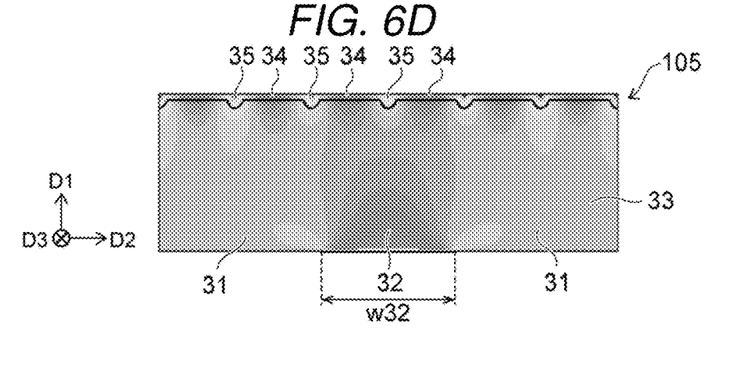

In a semiconductor device 105 illustrated in FIG. 6D, the pitch p32 is six times the pitch p35 (see FIG. 1). The pitch p32 is 204 μm, and the p⁺ type cathode W32 is 60 μm.

Other than the difference in ratio of pitches, the semiconductor devices 102 to 105 are similar to the semiconductor device 100.

Figure 7:
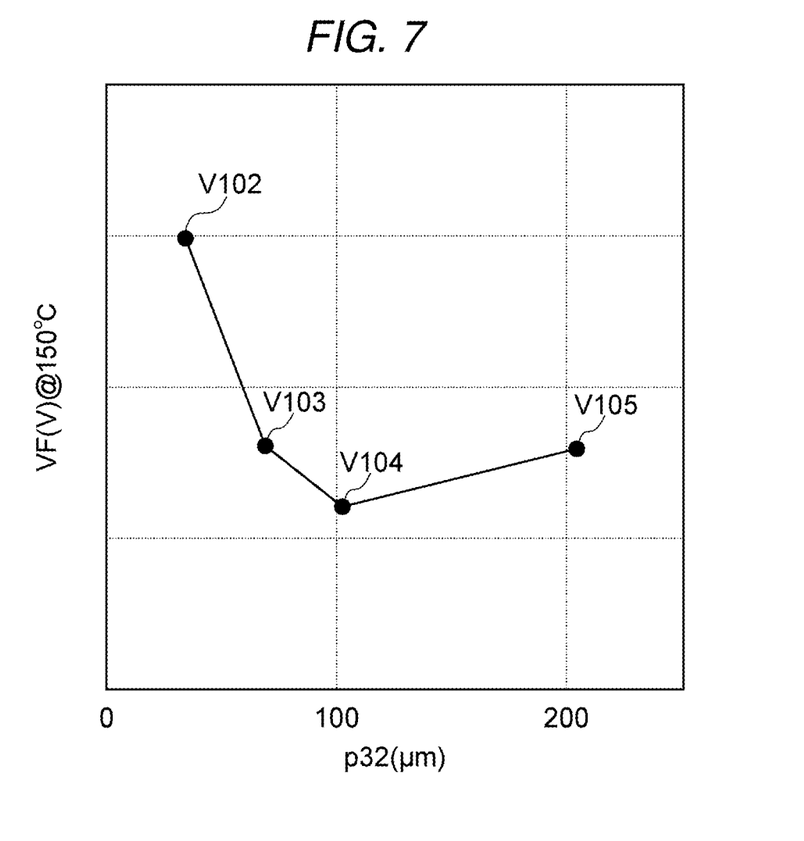
FIG. 7 is a graph illustrating simulation results obtained from semiconductor devices according to a first embodiment.

FIG. 7 is a graph illustrating simulation results obtained from the semiconductor devices 102 to 105 according to the first embodiment.

FIG. 7 illustrates on-voltages VF (V) for the semiconductor devices 102 to 105 (respectively described with reference to FIGS. 6A to 6D). Thus, voltages V102 to V105 represent on-voltages VF of the semiconductor devices 102 to 105.

As illustrated in FIG. 7, the on-voltage VF becomes minimal in the semiconductor device 104, in which the pitch p32 is three times the pitch p35.

In the semiconductor device 105, in which the pitch p32 and the p⁺ type cathode W32 are large as compared with the semiconductor device 104, the on-voltage VF increases. This is considered to be because, in the semiconductor device 105, the carrier density becomes low in regions above the plurality of p⁺ type cathode regions 32.

On the other hand, even in the semiconductor devices 102 and 103, in which the pitch p32 and the p⁺ type cathode W32 are small as compared with the semiconductor device 104, the on-voltage VF increases. This is considered to be because, in the semiconductor devices 102 and 103, the carrier injection amount from the cathode side decreases.

From the viewpoint of on-voltages VF, it is preferable that the pitch p32 be one to six times the pitch p35, and it is more preferable that the pitch p32 be two to six times the pitch p35. Moreover, it is preferable that the p⁺ type cathode W32 is 10 μm to 120 μm, and it is more preferable that the p⁺ type cathode W32 is 20 μm to 60 μm. Moreover, as illustrated in FIGS. 6A to 6D, the p⁺ type cathode W32 is smaller than the n⁺ type cathode width W31 (the length in the second direction D2 of one of the plurality of n⁺ type cathode regions 31). It is preferable that the n⁺ type cathode width W31 is 24 μm to 144 μm. This prevents or reduces an increase in on-voltage VF.

If a p⁺ type semiconductor region is provided at a part of the cathode to prevent or reduce the fluctuation of electric potential or current, the n⁺ type semiconductor region of the cathode decreases. Thus, a deterioration of characteristics exhibited at the time of electric conduction (for example, an increase in on-voltage VF) may occur in some cases. On the other hand, in the first embodiment, since the p⁺ type anode region 35 is located directly above each of the plurality of p⁺ type cathode regions 32, the fluctuation of electric potential or current can be better prevented or reduced. Therefore, the plurality of p⁺ type cathode regions 32 can be kept small. This prevents or reduces the deterioration of characteristics otherwise caused by providing a p⁺ type semiconductor region at a part of the cathode, i.e., a deterioration in characteristics caused by an n⁺ type semiconductor region of the cathode being decreased in size or the like.

MODIFICATION EXAMPLE

Figure 8A:
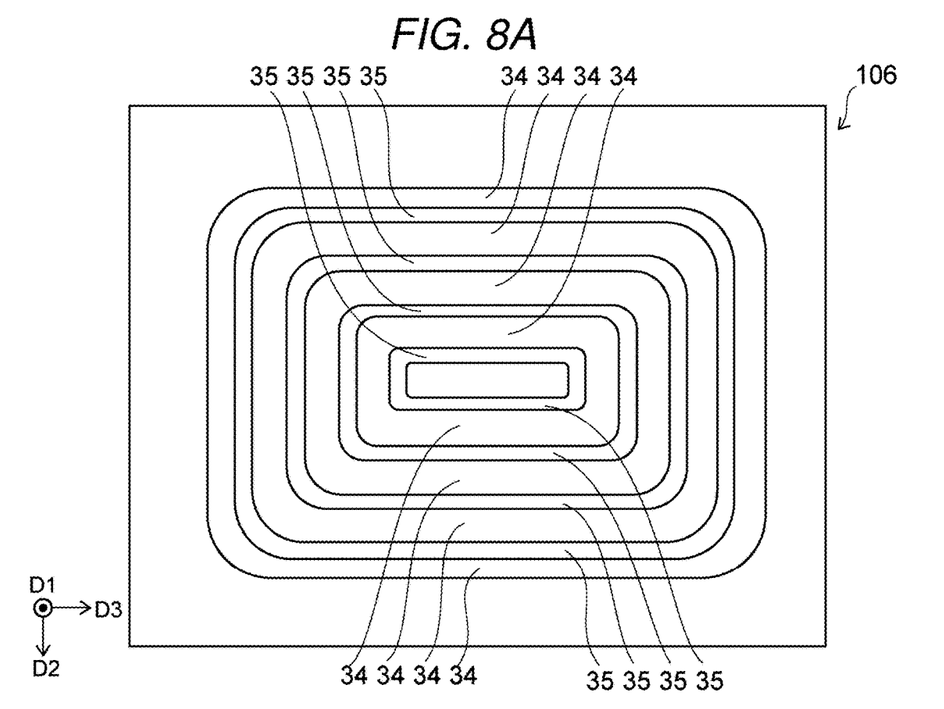
FIGS. 8A and 8B are plan views illustrating a semiconductor device according to a modification example of a first embodiment.
Figure 8B:
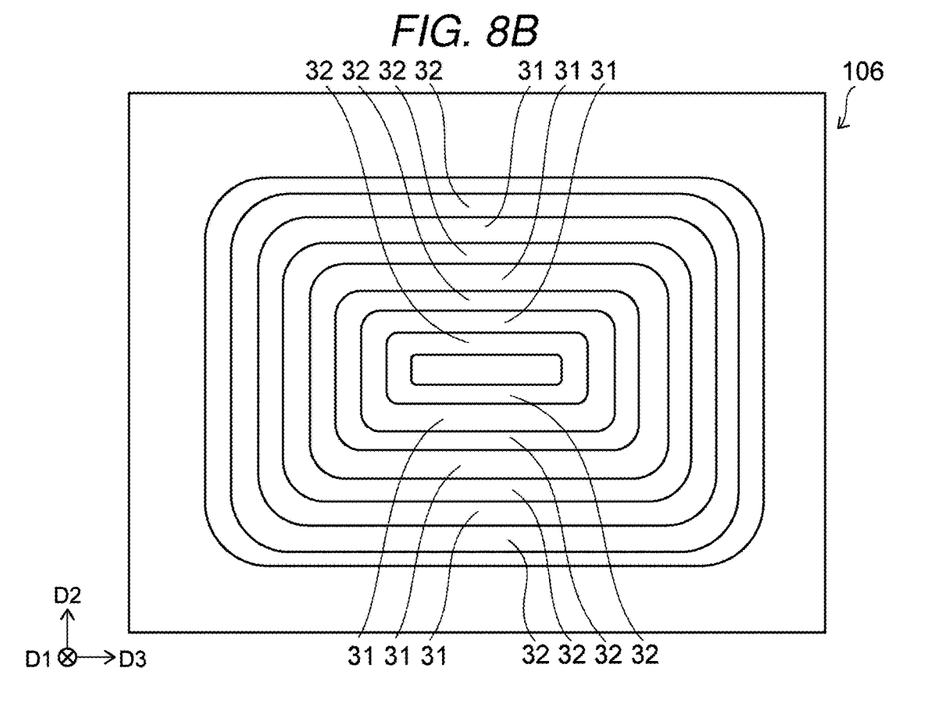

FIGS. 8A and 8B are plan views illustrating a semiconductor device according to a modification example of the first embodiment.

FIGS. 8A and 8B, as with FIGS. 2A and 2B, illustrate the obverse surface side and reverse surface side of a semiconductor device 106, respectively.

The semiconductor device 106 according to the modification example differs from the semiconductor device 100 in a planar pattern of semiconductor regions at the anode side and a planar pattern of semiconductor regions at the cathode side. Other than this, the semiconductor device 106 is similar to the semiconductor device 100.

As illustrated in FIG. 8A, a plurality of p type anode regions 34 and a plurality of p⁺ type anode regions 35 are provided in the semiconductor device 106. In this example, one of the plurality of p⁺ type anode regions 35 and another one of the plurality of p⁺ type anode regions 35 are continuous with each other in planar view and form an approximately rectangular ring shape. In other words, the plurality of p⁺ type anode regions 35 is a part (a portion extending in the third direction D3) of the p⁺ type semiconductor region, which is ring-shaped in planar view.

Similarly, in this example, one of the plurality of p type anode regions 34 and another one of the plurality of p type anode regions 34 are continuous with each other in planar view and form an approximately rectangular ring shape. In other words, the plurality of p type anode regions 34 is a part (a portion extending in the third direction D3) of the p type semiconductor region, which is ring-shaped in planar view.

Ring-shaped p type semiconductor regions including the plurality of p type anode regions 34 and ring-shaped p⁺ type semiconductor regions including the plurality of p⁺ type anode regions 35 are alternately arranged side by side with each other one by one in a concentric manner.

As illustrated in FIG. 8B, a plurality of n⁺ type cathode regions 31 and a plurality of p⁺ type cathode regions 32 are provided in the semiconductor device 106. In this example, one of the plurality of p⁺ type cathode regions 32 and another one of the plurality of p⁺ type cathode regions 32 are continuous with each other in planar view and form an approximately rectangular ring shape. In other words, the plurality of p⁺ type cathode regions 32 is a part (a portion extending in the third direction D3) of the p⁺ type semiconductor region, which is ring-shaped in planar view.

Similarly, in this example, one of the plurality of n⁺ type cathode regions 31 and another one of the plurality of n⁺ type cathode regions 31 are continuous with each other in planar view and form an approximately rectangular ring shape. In other words, the plurality of n⁺ type cathode regions 31 is a part (a portion extending in the third direction D3) of the n⁺ type semiconductor region, which is ring-shaped in planar view.

Ring-shaped p⁺ type semiconductor regions including the plurality of p⁺ type cathode regions 32 and ring-shaped n⁺ type semiconductor regions including the plurality of n⁺ type cathode regions 31 are alternately arranged side by side with each other one by one in a concentric manner.

In the semiconductor device 106, a p⁺ type anode region 35 is located directly above each of the p⁺ type cathode regions 32. This prevents or reduces the fluctuation of the first electrode 11 potential occurring at the time of turning-off and the vibration of a current flowing between the first electrode 11 and the second electrode 12. Accordingly, electrical characteristics of the semiconductor device 106 exhibited at the time of a cutoff of current can be improved.

Second Embodiment

Figure 9:
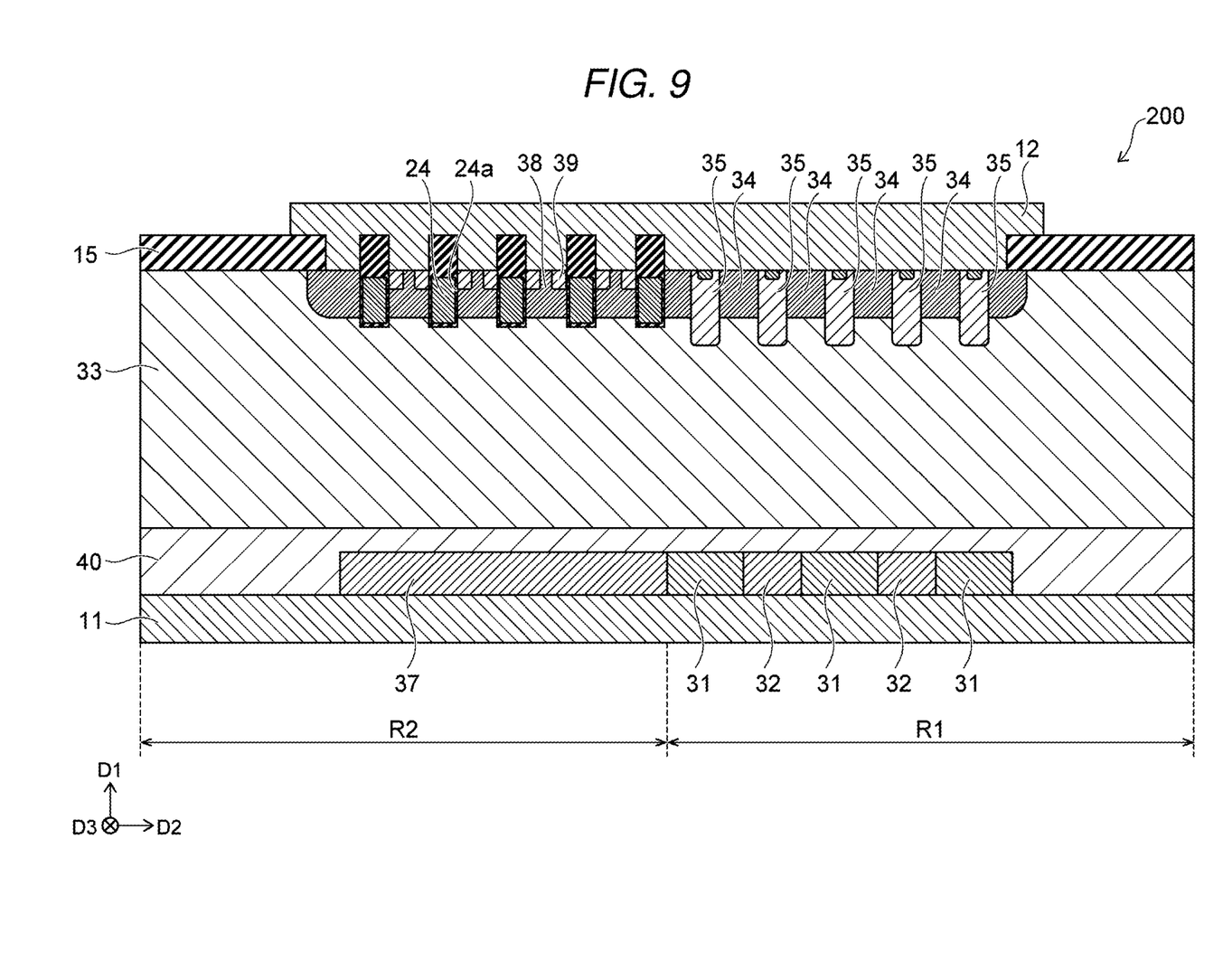
FIG. 9 is a cross-sectional view illustrating a semiconductor device according to a second embodiment.

FIG. 9 is a cross-sectional view illustrating a semiconductor device according to a second embodiment.

A semiconductor device 200 according to the second embodiment is a reverse-conducting insulated gate bipolar transistor (RC-IGBT). As illustrated in FIG. 9, the semiconductor device 200 includes a plurality of $n^+$ type cathode regions 31, a plurality of $p^+$ type cathode regions 32, an n type buffer region 40, an $n^-$ type drift region 33, a plurality of p type anode regions 34, a plurality of $p^+$ type anode regions 35, a first electrode 11, a second electrode 12, an insulating layer 15, a $p^+$ type collector region 37, a p type base region 38, an $n^+$ type emitter region 39, and a gate electrode 24.

The plurality of $n^+$ type cathode regions 31, the plurality of $p^+$ type cathode regions 32, and the $p^+$ type collector region 37 are provided on the first electrode 11 and are electrically connected to the first electrode 11. The $p^+$ type collector region 37 is located adjacent to the plurality of $n^+$ type cathode regions 31 in one direction perpendicular to the first direction D1. In the illustrated example, the $p^+$ type collector region 37 is located adjacent to the plurality of $n^+$ type cathode regions 31 in the second direction D2.

A part of the n type buffer region 40 is provided surrounding the plurality of $n^+$ type cathode regions 31, the plurality of $p^+$ type cathode regions 32, and the $p^+$ type collector region 37 along a first plane perpendicular to the first direction D1. Another part of the n type buffer region 40 is provided on the plurality of $n^+$ type cathode regions 31, the plurality of $p^+$ type cathode regions 32, and the $p^+$ type collector region 37.

The plurality of p type anode regions 34 is provided on the $n^-$ type drift region 33 and is located above the plurality of $n^+$ type cathode regions 31 and the plurality of $p^+$ type cathode regions 32. The p type base region 38 is provided on the $n^-$ type drift region 33 and is located above the $p^+$ type collector region 37. The p type base region 38 is located adjacent to the plurality of p type anode regions 34 in one direction perpendicular to the first direction D1. In the illustrated example, the p type base region 38 is located adjacent to the plurality of p type anode regions 34 in the second direction D2. The p type base region 38 maybe spaced from the plurality of p type anode regions 34 or may be directly adjacent to the plurality of p type anode regions 34.

The $n^+$ type emitter region 39 is provided on the p type base region 38. The second electrode 12 is electrically connected to the plurality of p type anode regions 34, the plurality of $p^+$ type anode regions 35, the p type base region 38, and the $n^+$ type emitter region 39.

The gate electrode 24 faces the p type base region 38 via a gate insulating layer 24a. In the illustrated example, the gate electrode 24 faces the p type base region 38 in one direction perpendicular to the first direction D1. The gate electrode 24 may be provided on the p type base region 38 and face the p type base region 38 via the gate insulating layer 24a in the first direction D1. The gate electrode 24 is electrically isolated from the second electrode 12.

The semiconductor device 200 includes a diode region R1 and an IGBT region R2. The plurality of $n^+$ type cathode regions 31, the plurality of $p^+$ type cathode regions 32, the plurality of p type anode regions 34, and the plurality of $p^+$ type anode regions 35 are provided in the diode region R1. The $p^+$ type collector region 37, the p type base region 38, the $n^+$ type emitter region 39, and the gate electrode 24 are provided in the IGBT region R2. In the semiconductor device 200, one diode region R1 and one IGBT region R2 are provided.

In the semiconductor device 200, a $p^+$ type anode region 35 is located directly above each of the $p^+$ type cathode regions 32. This prevents or reduces the fluctuation of the first electrode 11 potential occurring at the time of turning-off and the fluctuation of a current flowing between the first electrode 11 and the second electrode 12. Accordingly, electrical characteristics of the semiconductor device 200 exhibited at the time of a cutoff of current can be improved.

For each of the above-described embodiments, the relative highness or lowness of an impurity concentration between respective semiconductor regions is able to be checked by use of, for example, a scanning capacitance microscope (SCM). Furthermore, the carrier concentration in each semiconductor region can be deemed to be equal to an impurity concentration which is activated in each semiconductor region. Accordingly, the relative highness or lowness of a carrier concentration between respective semiconductor regions is also able to be checked with use of an SCM. Moreover, the impurity concentration in each semiconductor region is able to be measured with use of, for example, a secondary ion mass spectrometry (SIMS).

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein maybe made without departing from the spirit of the disclosure. The accompanying claims and their equivalents are intended to cover such forms or modifications as would fall within the scope and spirit of the disclosure.

What is claimed is:

1. A semiconductor device, comprising:
a first electrode;
a plurality of first semiconductor regions of a first conductivity type on the first electrode, the first semiconductor regions being spaced from each other in a first direction and extending in a second direction perpendicular to the first direction;
a plurality of second semiconductor regions of a second conductivity type on the first electrode, each second semiconductor region being adjacent to at least one of the first semiconductor regions in the first direction and extending in the second direction;
a third semiconductor region of the first conductivity type on the plurality of first semiconductor regions and the plurality of second semiconductor regions and having a dopant concentration of the first conductivity type that is less than that of the plurality of first semiconductor regions, the plurality of first semiconductor regions and the plurality of second semiconductor regions being between the third semiconductor region and the first electrode in a third direction orthogonal to the first and second directions;
a plurality of fourth semiconductor regions of the second conductivity type on the third semiconductor region, spaced from each other in the first direction, and extending in the second direction;
a plurality of fifth semiconductor regions of the second conductivity type on the third semiconductor region, the fifth semiconductor regions being adjacent to at least one fourth semiconductor region in the first direction, extending in the second direction, and having a dopant concentration of the second conductivity type that is greater than that of the plurality of fourth semiconductor regions; and a second electrode on the plurality of fourth semiconductor regions and the plurality of fifth semiconductor regions, wherein each second semiconductor region is directly below one of the plurality of fifth semiconductor regions in the third direction, and each fifth semiconductor region has a maximum width in the first direction that is less than a maximum width of each second semiconductor region in the first direction.

2. The semiconductor device according to claim 1, wherein each respective center in the first direction of the second semiconductor regions is directly below one of the plurality of fifth semiconductor regions in the third direction.

3. The semiconductor device according to claim 2, wherein every one of the fifth semiconductor regions is directly above one of the second semiconductor regions.

4. The semiconductor device according to claim 1, wherein every one of the fifth semiconductor regions is directly above one of the second semiconductor regions.

5. The semiconductor device according to claim 1, wherein a pitch of the plurality of second semiconductor regions in the first direction is an integer multiple of a pitch of the plurality of fifth semiconductor regions in the first direction.

6. The semiconductor device according to claim 5, wherein the pitch of the plurality of second semiconductor regions is twice the pitch of the plurality of fifth semiconductor regions.

7. The semiconductor device according to claim 5, wherein the pitch of the plurality of second semiconductor regions is greater than one and less than or equal to six times the pitch of the plurality of fifth semiconductor regions.

8. The semiconductor device according to claim 5, wherein the pitch of the plurality of second semiconductor regions in the first direction is not equal to the pitch of the plurality of fifth semiconductor regions in the first direction.

9. The semiconductor device according to claim 1, wherein the plurality of fifth semiconductor regions extend in the third direction into the third semiconductor region to a distance that is greater than a distance to which the plurality of fourth semiconductor regions extend in the third direction.

10. The semiconductor device according to claim 1, further comprising:
a plurality of sixth semiconductor regions of the second conductivity type provided respectively on the plurality of fifth semiconductor regions and having a dopant concentration of the second conductivity type greater than that of the plurality of fifth semiconductor regions.

11. The semiconductor device according to claim 10, wherein each sixth semiconductor region is in direct contact with the second electrode.

12. The semiconductor device according to claim 10, wherein each respective center in the first direction of the second semiconductor regions is directly below one of the plurality of sixth semiconductor regions in the third direction.

13. The semiconductor device according to claim 11, wherein each sixth semiconductor region is at a center of a respective one of the fifth semiconductor regions in the first direction.

14. The semiconductor device according to claim 1, further comprising:
a sixth semiconductor region of the second conductivity type on the first electrode and electrically connected to the first electrode;

a seventh semiconductor region of the second conductivity type on the third semiconductor region, above the sixth semiconductor region in the third direction, and electrically connected to the second electrode;

an eighth semiconductor region of the first conductivity type on the seventh semiconductor region; and a gate electrode facing the seventh semiconductor region via a gate insulating layer.

15. The semiconductor device according to claim 1, wherein
a maximum width of each fourth semiconductor region in the first direction is greater than the maximum width of each fifth semiconductor region in the first direction; and the maximum width of each fourth semiconductor region in the first direction is greater than the maximum width of each second semiconductor region in the first direction.

16. A semiconductor device, comprising:
a first electrode spaced from a second electrode in a first direction;

a plurality of first semiconductor regions of a first conductivity type on the first electrode and spaced from each other in a second direction, the first semiconductor regions extending in a third direction perpendicular to the second direction;

a plurality of second semiconductor regions of a second conductivity type on the first electrode, extending in the third direction, and arranged at a first pitch in the second direction;

a third semiconductor region of the first conductivity type above the plurality of first semiconductor regions and the plurality of second semiconductor regions in the first direction and having a dopant concentration of the first conductivity type that is less than that of the plurality of first semiconductor regions;

a plurality of fourth semiconductor regions of the second conductivity type on the third semiconductor region, spaced from each other in the second direction, and extending in the third direction; and a plurality of fifth semiconductor regions of the second conductivity type on the third semiconductor region and adjacent to the second electrode, the plurality of fifth semiconductor region extending in the third direction, having a dopant concentration of the second conductivity type greater than that of the plurality of fourth semiconductor regions, and being arranged at a second pitch in the second direction, wherein each second semiconductor region is directly below one of the plurality of fifth semiconductor regions in the first direction, and each fifth semiconductor region has a maximum width in the second direction that is less than a maximum width of each second semiconductor region in the second direction.

17. The semiconductor device according to claim 16, wherein the first pitch is equal to the second pitch.

18. The semiconductor device according to claim 16, wherein
the second pitch is an integer multiple of the first pitch, and the second pitch is not equal to the first pitch.

19. The semiconductor device according to claim 16, further comprising:
a plurality of sixth semiconductor regions of the second conductivity type provided respectively on the plurality of fifth semiconductor regions and having a dopant concentration of the second conductivity type greater than that of the plurality of fifth semiconductor regions.

20. The semiconductor device according to claim 19, further comprising:
- a seventh semiconductor region of the second conductivity type on the first electrode and electrically connected to the first electrode;
- an eighth semiconductor region of the second conductivity type on the third semiconductor region, above the seventh semiconductor region in the first direction, and electrically connected to the second electrode;
- a ninth semiconductor region of the first conductivity type on the eighth semiconductor region; and
- a gate electrode facing the eighth semiconductor region via a gate insulating layer.

* * * * *